(12) United States Patent
Berman

(10) Patent No.: US 6,347,291 B1
(45) Date of Patent: Feb. 12, 2002

(54) SUBSTRATE POSITION LOCATION SYSTEM

(75) Inventor: Michael J. Berman, West Linn, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/478,164

(22) Filed: Jan. 5, 2000

(51) Int. Cl.[7] .......................... G06F 17/00; G06F 19/00
(52) U.S. Cl. .......................... 702/150; 702/33; 702/34; 702/170; 700/121; 250/559.29; 356/400
(58) Field of Search .......................... 702/33, 34, 150, 702/170, 172; 438/5.14; 356/399, 400, 401; 250/559.29, 559.3; 700/121, 122, 125

(56) References Cited

U.S. PATENT DOCUMENTS

| | | | | |
|---|---|---|---|---|
| 4,467,211 A | * | 8/1984 | Smith et al. | 250/492.2 |
| 5,497,007 A | * | 3/1996 | Uritsky et al. | 250/491.1 |
| 5,610,102 A | * | 3/1997 | Gardopee et al. | 437/225 |
| 5,706,091 A | * | 1/1998 | Shiraishi | 356/399 |
| 6,092,052 A | * | 7/2000 | Ziano | 705/21 |
| 6,122,562 A | * | 9/2000 | Kinney et al. | 700/121 |

* cited by examiner

*Primary Examiner*—Kamini Shah
(74) *Attorney, Agent, or Firm*—Luedeka, Neely & Graham

(57) ABSTRACT

A system for precisely locating an absolute position of a target structure disposed at a known relative position on a substrate, where the substrate has devices in a pattern. Input means receive information, including a substrate size, a pattern offset, a device size, the known relative position of the target structure, and a target structure shape. Staging means receive the substrate in a known orientation. Processing means are used to locate several positions. A center position of the substrate is located from the substrate size and the known orientation of the substrate. A first intermediate position is located by combining the center position of the substrate with the pattern offset. A second intermediate position is located by combining the first intermediate position with at least a first component of the device size. A third intermediate position is located by combining the second intermediate position with the known relative position of the target structure. The absolute position of the target structure is located by comparing the target structure shape to shapes of structures disposed on the substrate in proximity to the third intermediate position, and aligning the target structure shape to a closest matching one of the structures disposed in proximity to the third intermediate position.

20 Claims, 2 Drawing Sheets

SUBSTRATE POSITION LOCATION SYSTEM

FIELD

This invention relates to the field of substrate processing. More particularly the invention relates to a highly automated system for locating precise positions on a substrate surface.

BACKGROUND

At a very basic level, the method by which semiconductor devices are made involves just a very few steps that are repeated over and over again until the device is formed. For the purposes of this discussion, these steps fall into three basic categories: deposition of a layer of material on the existing substrate, patterning of a layer of material, and removal of a portion of a layer of material. While there are certainly many other steps involved with semiconductor fabrication, and many variations on those recited above, these three steps tend to be the basis of microelectronic processing.

In all three of the steps mentioned, thickness measurements are critically important. For example, layers of material are deposited to desired thicknesses and a desired thickness of photoresist is typically used to pattern the layers of material. The third general step, removing a portion of the layer of the material, can be further resolved into two general categories, either thinning or planarizing the entire layer or removing the entire thickness of the layer in specific locations. The importance of accurate measurement of the thickness of the layer cannot be overstated when thinning a layer to the desired thickness.

There are several reasons why a layer may need to be thinned to a specific thickness. One reason, briefly alluded to above, is to planarize the layer. In a planarization process, the portions of the layer that are relatively higher than the lower portions of the layer are selectively thinned, thus producing a more generally level top surface for the layer. One way to planarize or otherwise thin a layer is to abrade the surface of the wafer against a pad. Water or some other liquid can be introduced during the abrasion process to help carry away the material that is removed from the layer as it wears against the pad. In addition, other materials such as grit or chemical etchants can be added to the water to increase either the rate or the uniformity of the thinning action.

It is helpful to measure the thickness of a layer at some point prior to beginning a thinning process so that an initial determination can be made as to how long the wafer should be subjected to the thinning process. Additionally, it is helpful to make intermediate measurements during the thinning process so that the layer is not thinned excessively. Thus, measurement of the thickness of the layer plays an important role in this process.

As many as fifty or more layers may need to be processed in the manner described above in order to produce some integrated circuits. In addition, the wafer fab producing the devices may process thousands of different devices. Typically, each layer must be measured at a different location on the surface of the wafer. Further, each of the different devices produced will tend to have measurement locations in a different position. Thus, many thousands of different locations for layer thickness measurement may need to be identified and tracked.

While the position on the wafer for each of these thousands of measurement locations could be manually located by an operator using a microscope, and the measurements manually taken after the measurement location is individually located, such a system would tend to be fraught with the mistakes that are prone to occur when a person performs a repetitive task selected from thousands of different repetitive tasks.

What is needed, therefore, is a system that automates portions of the thickness measurement process, so that at least some of the errors produced by human mistakes can be eliminated.

SUMMARY

The above and other needs are met by a system for precisely locating an absolute position of a target structure disposed at a known relative position on a substrate, where the substrate has devices in a pattern. Input means receive information, including a substrate size, a pattern offset, a device size, the known relative position of the target structure, and a target structure shape. Staging means receive the substrate in a known orientation.

Processing means are used to locate several positions. A center position of the substrate is located from the substrate size and the known orientation of the substrate. A first intermediate position is located by combining the center position of the substrate with the pattern offset. A second intermediate position is located by combining the first intermediate position with at least a first component of the device size. A third intermediate position is located by combining the second intermediate position with the known relative position of the target structure.

The absolute position of the target structure is located by comparing the target structure shape to shapes of structures disposed on the substrate in proximity to the third intermediate position, and aligning the target structure shape to a closest matching one of the structures disposed in proximity to the third intermediate position.

Thus, the absolute position of the target structure is determined by using physical data, such as the size of the substrate and the known orientation of the substrate, data relating to the devices that are patterned on the substrate, including device size, and relative data, such as the general location of the target structure within the device. In this manner, an operator can quickly program a substrate position location system that can receive a wafer and find a position on the wafer that is close enough to the absolute position of the target structure on the die, that the absolute position of the target structure can be found with techniques such as small field pattern recognition. By inputting data of this type, the operators tend to make fewer mistakes in programming systems, such as metrology systems, as to where to take thickness measurements. Reducing these types of errors also tends to reduce the number of wafers that are scrapped or reworked, thus lowering costs.

There are many preferred embodiments of the system described above, as briefly mentioned below. In one, the processing means locates the third intermediate position by combining the substrate size, the known orientation of the substrate, the pattern offset, at least the first component of the device size, and the known relative position of the target structure, without independently locating the center position of the substrate, the first intermediate position, and the second intermediate position.

Positioning means dispose the absolute position of the target structure adjacent a test zone. Measurement means measure within the test zone a thickness of a layer of material on the substrate within the target structure.

Further, the processing means include means for locating a plurality of absolute positions of the target structure by combining the third intermediate position with multiples of the device size to produce a plurality of closely approximated positions. The processing means locate the plurality of absolute positions of the target structure by comparing the target structure shape to shapes of structures disposed in proximity to the closely approximated positions, and aligning the target structure shape to a closest matching one of the structures disposed in proximity to each of the closely approximated positions.

Also described is a method for precisely locating an absolute position of a target structure disposed at a known relative position on a substrate having devices in a pattern. Information is input to a processing means. The information includes a substrate size, a pattern offset, a device size, the known relative position of the target structure, and a target structure shape. The substrate is received in a known orientation.

A center position of the substrate is located from the substrate size and the known orientation of the substrate, using the processing means. A first intermediate position is located by combining the center position of the substrate with the pattern offset using the processing means. A second intermediate position is located by combining the first intermediate position with at least a first component of the device size using the processing means. A third intermediate position is located by combining the second intermediate position with the known relative position of the target structure using the processing means.

The absolute position of the target structure is located by comparing the target structure shape to shapes of structures disposed on the substrate in proximity to the third intermediate position, and aligning the target structure shape to a closest matching one of the structures disposed in proximity to the third intermediate position.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
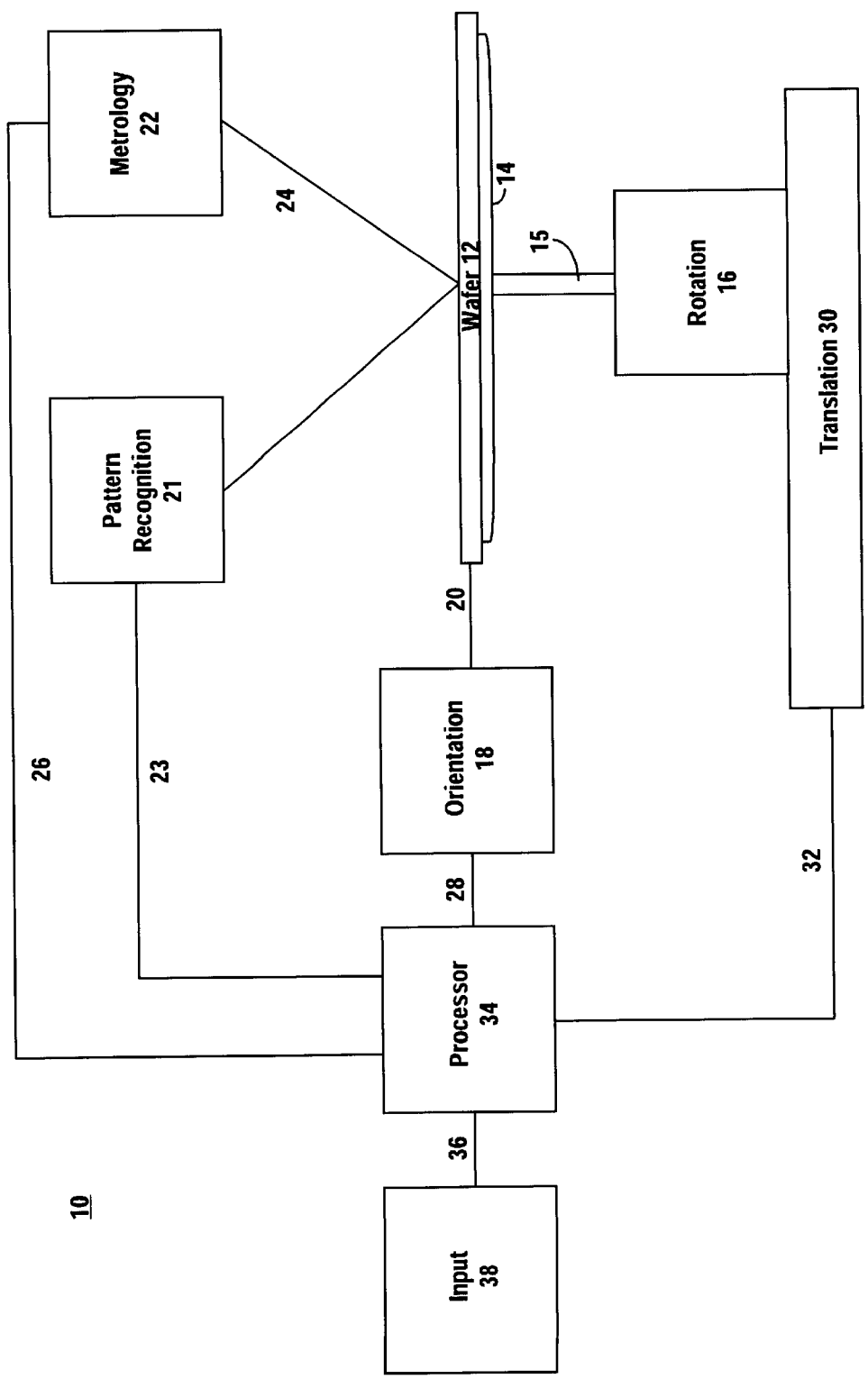
FIG. 1 is a functional schematic diagram of an embodiment of a system according to the invention.

Referring now to FIG. 1, there is depicted a substrate position location system 10 according to the present invention. The substrate position location system 10 is useful for positioning a wafer 12 in relationship to a metrology unit 22. More specifically, the substrate position location system 10 locates an absolute position on the wafer 12, which absolute position is known only as a relative position on the wafer 12, and disposes the wafer 12 according to the determined absolute position at a specific location relative to the metrology unit 22, so that the metrology unit 22 can effect a thickness measurement at the absolute position. It will be appreciated that this same substrate position location system 10 could be used for other purposes by adding additional sensory or processing equipment to, or in place of, the metrology unit 22.

The substrate position location system 10 includes a staging means for receiving the wafer 12 in a known orientation. As depicted in FIG. 1, the staging means includes at least portions of the wafer chuck 14, height adjustment unit 15, rotation unit 16, translation unit 30, and orientation unit 18. The wafer chuck 14 includes means to retain the wafer 12 in a fixed relationship relative to the wafer chuck 14. Such means are well known in the art, and include means such as a vacuum source and vacuum distribution channels within the wafer chuck 14. Other means that are compatible with the design and operation of the substrate position location system 10 as described herein are also anticipated by this disclosure.

The wafer chuck 14 is connected to a height adjustment unit 15, which is operable to raise and lower the wafer 12 in an axis substantially perpendicular to the plane of the wafer 12. Many different types of mechanisms can be used as the height adjustment unit 15, such as an air pot or a stepper motor connected to a rack and pinion mechanism. The height adjustment unit 15 is connected to the rotation unit 16, which is operable to rotate the wafer 12 about a central axis perpendicular to the plane of the wafer 12, and within the plane of the wafer 12. Many different types of rotary actuators are acceptable for this purpose, such as an electric stepper motor.

The rotation unit 16 is connected to a translation unit 30, which is operable to translate the rotation unit 16, the wafer chuck 14 and the wafer 12 in the two axes in which the plane of the wafer 12 resides. As with some of the other units mentioned above, the translation unit 30 may be provided by any one or more of a number of different types of devices. For example, the translation unit 30 may include two lead screws, each disposed in a different of the two axes, which are independently driven by stepper motors. Alternately, the translation unit includes an indexed electromagnetic base with individually addressable lines, which can draw a platform smoothly across a surface in any combination of the two axis in which the surface is disposed.

The wafer chuck 14, height adjustment unit 15, rotation unit 16, and translation unit 30 all work cooperatively to bring the wafer 12 into a known orientation relative to the metrology unit 22. This is preferably accomplished with the orientation unit 18. In a preferred embodiment, the orientation unit 18 senses a known physical characteristic of the wafer 12 using means 20. The means 20 may be a physical means, such as a feeler gauge that physically contacts the edge or surface of the wafer 20. Alternately, the means 20 detects the physical characteristic of the wafer 12 without touching the wafer 12, such as by using a light source and a light sensor.

The physical characteristic of the wafer 12 that is sensed may take many forms, such as a notch in the edge of the wafer 12, a flat portion along the circumference of the wafer 12, or a series of major and minor flat portions along the circumference of the wafer 12. The orientation unit 18 is preprogrammed to sense one of more of the physical characteristics that may be present in the wafer 12.

In operation, the wafer chuck 14, height adjustment unit 15, rotation unit 16, and translation unit 30, collectively referred to as the staging means, bring the wafer 12 into a position where the means 20 of the orientation unit 18 can sense the physical characteristic of the wafer 12. The staging means translate, rotate, and raise and lower the wafer as required until the orientation unit 18 detects a physical characteristic of the wafer 12 that is understood by the orientation unit 18. Thus, the orientation unit 18 feeds information about its progress in locating the physical characteristic of the wafer 12 on lines 28 to a processor 34, which directs the operation of the staging means via lines 32.

When the orientation unit 18 detects a known physical characteristic of the wafer 12, it reports this to the processor 34 on the lines 28. At this point in time, the processor 34 makes a record of the orientation of the wafer 12 using position information from the staging means via lines 32. The processor 34 may then direct the staging means to position the wafer 12 at any other orientation relative to the physical characteristic of the wafer 12, which is known. Most notably, the processor is preferably used to direct the staging means to position the wafer 12 at such a known orientation relative to the metrology unit 22, the position of which is most preferably fixed, and which is also known by the processor 34.

While a very detailed embodiment of the staging means has been described above, it is appreciated that in other embodiments, the staging means includes nothing more than a stop at a position in which a wafer 12, which has already been oriented by a wafer chuck 14, height adjustment unit 15, rotation unit 16, translation unit 30, and orientation unit 18 that are external to and not a part of the substrate position location system 10, is brought up against. This stop is in a location that is known by the processor 34, relative to the metrology unit 22. In this embodiment, the processor 34 assumes that the wafer 12 has already been placed in a first known orientation by the external means, and thus, when the wafer 12 is delivered to the known position of the stop within the substrate position location system 10, the wafer 12 is received at the stop position in a known orientation.

Once the wafer 12 is in a known position relative to the metrology unit 22, one or more absolute positions on the wafer 12 are located on the wafer 12 using relative position information. Most preferably, these absolute positions are then placed in proximity to the metrology unit 22 by the staging means, or alternately, the metrology unit 22 is moved relative to the fixed and known orientation of the wafer 12, so that the metrology unit 22 can use sensing means 24 to take measurements on the wafer 12 at the absolute positions on the wafer 12 so determined.

The sensing means 24 define a test zone within which a measurement is made. The sensing means 24, in the case of a metrology unit 22, may take one or more different forms. For example, the sensing means 24 may be a physical stylus that senses a step height. Alternately, the sensing means 24 may be a light beam and accompanying optical sensor, which may detect interference patterns and standing waves, or the change in the polarity of the light beam. Other methods of measuring the thickness of layers on the surface of a wafer 12 that are compatible with the method as described herein are also comprehended.

The relative position information used to determine the absolute positions on the wafer 12 is input via input means 38, and most preferably includes a wafer size, a pattern is offset, a device size, the known relative position of a target structure from which the metrology 22 will make a measurement, and a target structure shape. This information is described in more detail below.

The input means 38 may be a keyboard at which an operator types in the relevant information received from a physical document. More preferably, the input means further includes an electronic interface that receives the relevant information from an electronic document that is received via a medium such as a local disk or a network connection. In this latter embodiment, the operator may specify which electronic document to use by typing in identifying information about the wafer 12 on a keyboard. Alternately, the wafer 12 identification information is input to the substrate position location system 10 by a bar code scanning unit that is incorporated into the input means 38. Further, the wafer 12 identification information may be detected automatically by the sensing means 20 of the orientation unit 18, which detects information that is physically encoded onto the wafer 20.

In a preferred embodiment of a method according to the present invention, the relative information is taken from a document that is produced for the wafer 12 at a prior processing step. Most preferably, this prior processing step is a photolithography step, in which one of the layers of the devices that are to be formed on the wafer 12 is aligned to the wafer 12 and exposed in photoresist on the surface of the wafer 12. This document 48, depicted in FIG. 2 in hard-copy form, contains substantially all of the relevant relative information required to locate the absolute location of a target structure on the wafer 12.

Figure 2:
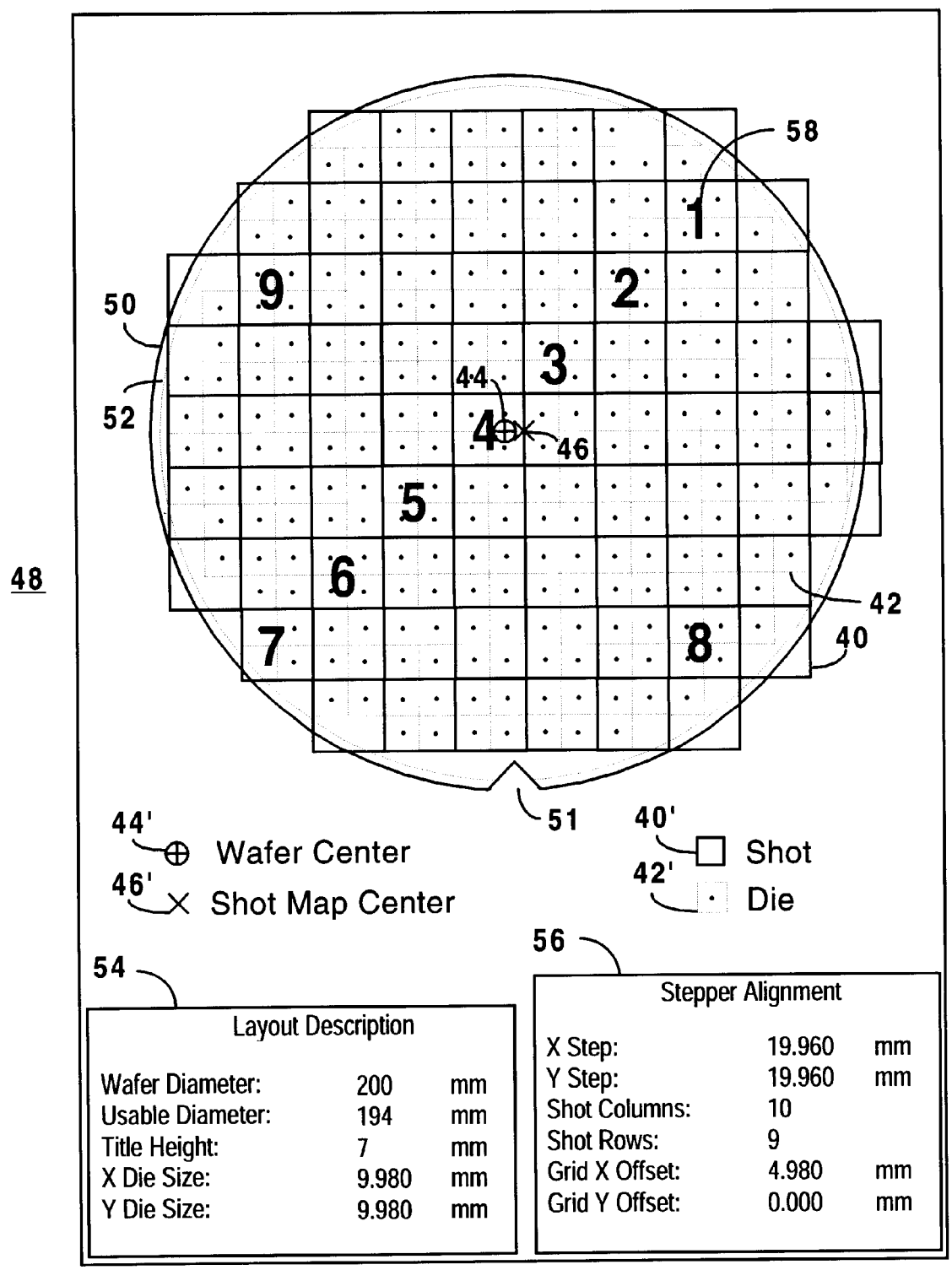
FIG. 2 is a depiction of a hard copy wafer stepper information document.

The document 48, whether in hard copy form as depicted or in electronic form, contains a representation 50 of some type of the wafer 12. Also included may be an indication 52 of the useable space on the surface of the wafer 12. The map of the wafer 12 includes a representation of the individual shots 40 that are exposed in a stepped pattern across the surface of the wafer 12. In the example as depicted in FIG. 2, the shots 40 each contain a pattern of four dice 42, which represent individual devices. In the hard copy format depicted in FIG. 2, there is a legend character 40' and 42' for each of the shot structure and the die structure. The document 48 also specifies the absolute location of the center 44 of the wafer 12 and a shot map center 46. As before, a legend character 44' and 46' are provided for each of the wafer 12 center 44 structure and the shot map center 46 structure.

Blocks of information are also preferably provided on the hard copy of the document 48. Depicted in FIG. 2 are two of the more relevant blocks of information, including the layout description block 54 and the stepper alignment block 56. The layout description block 54 preferably contains at least a measurement for the wafer diameter, the X die size, and the Y die size, given in some known unit of measure, which in the example depicted in FIG. 2 is millimeters. The stepper alignment block 56 preferably contains at least a grid X offset value and a grid Y offset value, also given in some known unit of measure, which in the example depicted in FIG. 2 is again millimeters. Finally, there is also preferably included information in regard to the relative position of measurement target structure, depicted in the diagram as the numerical characters one through nine, designated as 58 in FIG. 2. The value and use of this information is described more completely below.

In an electronic document 48, as opposed to the hard copy document 48 depicted, the relative position information provided preferably includes the wafer diameter, the X die size, the Y die size, the grid X offset, the grid Y offset, and the relative locations 58 of the target structures, and information about the shape of the target structure. The use of this information to determine the absolute position of one or more of the target structures is preferably accomplished in a single step. However, the method is more clearly understood by describing the process as a series of smaller and more intermediate steps.

First, the center 44 of the wafer 12 is located by using the wafer diameter information, which is also referred to as the substrate size, and the known orientation of the wafer 12, which was determined as described at length above. This is a fairly straightforward operation, wherein the processor directs the staging means, or the metrology unit 22, to move either the wafer 12 or the metrology unit 22 relative to the other, so that the metrology unit 22 is disposed at a position that is one half of the diameter of the wafer 12 along a center cross section of the wafer 12.

Once the center position of the wafer 12 is located, a first intermediate position is located by combining the center position of the substrate with the pattern offset. The pattern offset preferably has two components, which are a grid X offset and a grid Y offset. In the example depicted in FIG. 2, the grid X offset has a value of 4.980 millimeters, and the grid Y offset has a value of 0.000 millimeters. In other examples these offsets may vary with any combination of positive, negative, or zero values. Typically, and most preferably, these grid offset components of the pattern offset have values that are less than the corresponding die size values given in the document 48.

In the example depicted in FIG. 2, the first intermediate position is located by adding the grid X offset to the center 44 position of the wafer 12. The grid Y offset can be ignored in this example, because it has a value of zero. In the intermediate procedure described herein, in which each of the intermediate steps is considered to be a separate step, the wafer 12 is positioned relative to the metrology unit 22 proximate the shot map center 46, which is also the first intermediate position. As described above, either the wafer 12 can be positioned using the staging means, or the metrology unit 22 can be positioned, either or both of which are preferably under the control of the processor 34, which is also preferably used to determine the position locations as described herein.

Similar to the center 44, which refers to the center of the wafer 12 as the name implies, the shop map center 46 is the logical center of the shot map, and thus is also the logical center of the device pattern on the surface of the wafer 12. It is at this step of the method that the orientation of the wafer 12 is provided with a relationship to the relative positioning of the devices and other structures on the surface of the wafer 12. Thus, it is at this step in the method that the absolute positions on the wafer 12 are referenced to the relative positions on the wafer 12. This is possible because the orientation of the shot map is known relative to the sensed physical characteristic of the wafer 50. In the example depicted in FIG. 2, the shot map is orthogonal to the notch 51 in the wafer 50.

Because the components of this offset position are determined and known at the photolithography step of the fabrication process, this information can be retained and used by the substrate position location system 10. Thus, rather than having an operator determine such information by merely searching for an offset, the already known value can be keyed in to the input means 38, or received from a central repository of such information via a network or other means. In this manner, operator error in locating the offset is dramatically reduced.

After locating the first intermediate position, a second intermediate location is located by combining the first intermediate position with at least a first component of the device size, which is either the X die size or the Y die size. The second intermediate position preferably represents a corner of the shot 40 pattern, which in the example depicted in FIG. 2 is a set of four devices or dice 42. From this relative position, the relative position of the desired target structure is preferably known. However, in other embodiments, the relative position of the desired target structure is known from other relative positions, such as the first intermediate position. In that embodiment, determining the other intermediate positions is not necessary.

Depending on which corner of the shot pattern 40 it is desired to locate, only one of the components of the die size may need to be used to locate the second intermediate position. For example, to locate the upper right hand corner of the shot 40 to the left of the shot map center 46, only the Y die size component of the device size needs to be used. In other words, adding the Y die size to the location coordinates of the shot map center is sufficient to locate the upper right hand corner of that particular shot 40. If the position of the target structure desired is known relative to that location, then only the Y die size component is required in this step of the method.

However, if it is more preferred to reference the position of the desired target structure from another position within the shot 40, such as a top center position, then both the X component and the Y component of the device size are preferably used to determine the second intermediate position. It is appreciated that the use of the two different components is also at least in part dependent on the location of the first intermediate position. For example, as depicted in FIG. 2, the first intermediate position is located at the outside adjoining corners of two dice 42 at the edge of a shot 40. If the offsets referenced a different position within the shot 40, such as the center point at which one corner each of all four of the dice 42 converged, then this also would affect the die size components that are preferably used to determine the second intermediate position.

As mentioned above, once the second intermediate position is determined, the staging means can be used to position the second intermediate position adjacent the sensing means 24 of the metrology unit 22. Alternately, the metrology unit 22 is moved to position the sensing means 24 proximate the second intermediate position. In other embodiments, no movement or other positioning of the wafer 12 is performed at this point, but rather all positioning of the wafer 12 is performed once the final absolute position of the target structure is determined, as mentioned above.

After the second intermediate position is determined, it is combined with the known relative position of the target structure to determine a third intermediate position. This again assumes that the relative position of the target structure is given relative to the second intermediate position. If the relative position of the target structure is given relative to one of the predecessor intermediate positions, then it is not necessary to determine the intermediate positions subsequent to that predecessor intermediate position. The relative position of the target structure location is preferably given in more than one component, such as an X or Y component or offset from the referenced intermediate position, such as the second intermediate position. It is appreciated that all of the offsets or position components as described herein may be specified in a coordinate system other than the rectangular or Cartesian coordinate system, such as the polar coordinate system.

At this point, by following the method as described above, the absolute location of the desired target structure has been located on the wafer 12, and this position on the wafer 12 can be aligned with the sensing means 24 of the metrology unit 22. However, some types of metrology units 22, or other sensory equipment as may be included with the substrate position location system 10, may require extremely precise position location information in order to accurately use the target structure. For example, the degree to which the location of the target structure must be known might be finer than the error within the various offsets and other information as provided to the substrate position location system 10.

In this case, there is preferably provided a small field pattern recognition system 21 to more precisely align the wafer 12 to the metrology unit 22. In a preferred embodiment, this is accomplished by comparing the target structure shape information to the shapes of structures disposed on the substrate in proximity to the third intermediate position, and aligning the target structure shape to a closest matching one of the structures disposed in proximity to the third intermediate position. Information between the small field pattern recognition system 21 and the processor 24 is communicated from one to other on lines 23. The processor 34 uses the information from the small field pattern recognition system 21 to more finely adjust the relative positions of the metrology unit 22 and the wafer 12, by using the staging means. In this manner, very precise positioning of the wafer 12 with reference to the metrology unit 22 is accomplished.

Further, a great deal of human interaction, and possibility for error, has also been removed by use of the method described above. For example, aligning the metrology unit 22 to the wrong target structure is one such error that is dramatically reduced, because the operator does not have to remember the shape of the target structure that he is searching for. Further, and especially in the embodiment where the document 48 is received electronically, data entry errors are significantly reduced, and the location of the desired target structure is determined in an extremely quick and automated fashion.

These benefits are compounded when the method is applied to fabrication processes that produce many different layers. In addition, this method is further beneficial when locating target structures that may be found in many different parts of the wafer 12, including without limitation the scribe lines between the dice 42, in special test dice, in production dice, or even functional elements of the production dice. In cases in which the target structures for each of several different layers on a device are located in different positions, the preferred embodiment of a method according to the present invention can help make an extremely error-prone process of tracking and locating the target structures virtually automatic and fool-proof.

As previously mentioned, the detailed description of the method of an apparatus according to the present invention as given above specified that several intermediate positions where separately located and the position of either the wafer 12 or the metrology unit 22 was moved to align the wafer 12 and the metrology unit 22 at these positions on the wafer 12. However, and also as mentioned above, most preferably the third intermediate position is located in a single step using the information described, and the metrology unit 22 is immediately disposed adjacent the third intermediate position without first orienting the metrology unit 22 to any of the prior intermediate positions described above. From the third intermediate position, the small field pattern recognition system 21 is used to precisely determine the absolute position of the target structure, and the staging means are used to make a final fine position adjustment, as necessary.

Once the absolute position of the target structure is located, and the wafer 12 and the metrology unit 22 are properly aligned, the measurement is taken. In the example described herein, it has been assumed that the measurement is a thickness measurement. However, as mentioned above, other measurements or processing could be accomplished at this point. For example, the test structure could be electrically probed by a test unit that is properly configured. Further, after the first test structure is located, additional similarly disposed test structures can also be readily located by use of the information provided.

For example, others of the same test structure, indicated in FIG. 2 by the numerals one through nine, and generally designated as 58 are located by adding or subtracting appropriate multiples of the X step and Y step components of the shot 40 size. This highly automated procedure quickly determines the additional locations of the test structure so that additional measurements can be taken. Use of the small field pattern recognition system 21 at each of the positions determined may optionally be employed as necessary. Of course, many other patterns are possible in addition to the one simple pattern proposed in FIG. 2. By taking multiple readings across the surface of the wafer 12, information in regard to the variation of the characteristic being measured across the surface of the wafer 12 can be generated. This information is then used to further control the processing of the wafer 12 that is monitored by the substrate position location system 10.

It is appreciated that the invention as described above comprehends numerous adaptations, rearrangements, and substitutions of parts, all of which are considered to be within the scope and spirit of the invention as described, and that the scope of the invention is only to be restricted by the language of the claims given below.

What is claimed is:

1. A system for precisely locating an absolute position of a target structure disposed at a known relative position on a substrate having devices in a pattern, the system comprising:
   input means for receiving information including a substrate size, a pattern offset, a device size, the known relative position of the target structure, and a target structure shape,
   staging means for receiving the substrate in a known orientation, and processing means for;
      locating a center position of the substrate from the substrate size and the known orientation of the substrate,
      locating a first intermediate position by combining the center position of the substrate with the pattern offset,
      locating a second intermediate position by combining the first intermediate position with at least a first component of the device size,
      locating a third intermediate position by combining the second intermediate position with the known relative position of the target structure, and
      locating the absolute position of the target structure by comparing the target structure shape to shapes of structures disposed on the substrate in proximity to the third intermediate position, and aligning the target structure shape to a closest matching one of the structures disposed in proximity to the third intermediate position.

2. The system of claim 1 wherein the processing means locates the third intermediate position by combining the substrate size, the known orientation of the substrate, the pattern offset, at least the first component of the device size, and the known relative position of the target structure, without independently locating the center position of the substrate, the first intermediate position, and the second intermediate position.

3. The system of claim 1 further comprising positioning means to dispose the absolute position of the target structure adjacent a test zone.

4. The system of claim 3 further comprising measurement means for measuring within the test zone a thickness of a layer of material on the substrate within the target structure.

5. The system of claim 1 wherein the processing means further comprise means for locating a plurality of absolute positions of the target structure by combining the third intermediate position with multiples of the device size to produce a plurality of closely approximated positions, and for locating the plurality of absolute positions of the target structure by comparing the target structure shape to shapes of structures disposed in proximity to the closely approximated positions, and aligning the target structure shape to a closest matching one of the structures disposed in proximity to each of the closely approximated positions.

6. The system of claim 1 wherein the input means further comprises means for receiving the substrate size, the pattern offset, and the device size in electronic form from stepper setup documentation.

7. The system of claim 1 wherein the first component of the device size further comprises a Y coordinate die size.

8. The system of claim 1 wherein the first component of the device size further comprises an X coordinate die size.

9. The system of claim 1 wherein the means for receiving the substrate in a known orientation further comprise:
   rotation means for rotating the substrate about a first axis and substantially within a plane determined by the substrate,
   sensory means for detecting a position indicating physical characteristic of the substrate, and
   the rotation means further for stopping the rotation of the substrate when the substrate is in the known orientation relative to the position indicating physical characteristic of the substrate.

10. A metrology system for precisely locating an absolute position of a target structure disposed at a known relative position on a substrate having devices in a pattern, for positioning the target structure within a test zone, and measuring a thickness of a layer of material on the surface of the substrate within the target structure, the system comprising:
   input means for receiving a substrate size, a pattern offset, and a device size in electronic form from stepper setup documentation, and further for receiving the known relative position of the target structure, and a target structure shape,
   staging means for receiving the substrate in a known orientation,
   processing means for;
      locating a intermediate position by combining the substrate size, the known orientation of the substrate, the pattern offset, at least a first component of the device size, and the known relative position of the target structure, and
      locating the absolute position of the target structure by comparing the target structure shape to shapes of structures disposed on the substrate in proximity to the intermediate position, and aligning the target structure shape to a closest matching one of the structures disposed in proximity to the intermediate position,
   positioning means for disposing the absolute position of the target structure adjacent a test zone, and
   measurement means for measuring within the test zone a thickness of a layer of material on the surface of the substrate within the target structure.

11. The metrology system of claim 10 further comprising:
   the processing means further having;
      means for locating a plurality of absolute positions of the target structure by combining the intermediate position with multiples of the device size to produce a plurality of closely approximated positions, and
      means for locating the plurality of absolute positions of the target structure by comparing the target structure shape to shapes of structures disposed on the substrate in proximity to the closely approximated positions, and aligning the target structure shape to a closest matching one of the structures disposed in proximity to each of the closely approximated positions,
   the positioning means further having means for positioning at least one of the plurality of absolute positions of the target structure adjacent the test zone, and
   the measurement means further having means for measuring within the test zone the thickness of the layer of material on the surface of the substrate within the target structure at the at least one of the plurality of absolute positions.

12. A method for precisely locating an absolute position of a target structure disposed at a known relative position on a substrate having devices in a pattern, the method comprising the steps of:
   inputting information to a processing means, the information including a substrate size, a pattern offset, a device size, the known relative position of the target structure, and a target structure shape,
   receiving the substrate in a known orientation,
   locating a center position of the substrate from the substrate size and the known orientation of the substrate, using the processing means,
   locating a first intermediate position by combining the center position of the substrate with the pattern offset using the processing means,
   locating a second intermediate position by combining the first intermediate position with at least a first component of the device size using the processing means,
   locating a third intermediate position by combining the second intermediate position with the known relative position of the target structure using the processing means, and
   locating the absolute position of the target structure by comparing the target structure shape to shapes of structures disposed on the substrate in proximity to the third intermediate position, and aligning the target structure shape to a closest matching one of the structures disposed in proximity to the third intermediate position.

13. The method of claim 12 wherein the steps of locating the center position of the substrate, locating the first intermediate position, locating the second intermediate position, and locating the third intermediate position are accomplished with the processing means by combining the substrate size, the known orientation of the substrate, the pattern offset, at least the first component of the device size, and the known relative position of the target structure, without independently locating the center position of the substrate, the first intermediate position, and the second intermediate position.

14. The method of claim 12 further comprising the step of disposing the absolute position of the target structure adjacent a test zone.

15. The method of claim 14 further comprising the step of measuring within the test zone a thickness of a layer of material on the substrate within the target structure.

16. The method of claim 12 further comprising the step of locating a plurality of absolute positions of the target structure using the processing means by:
   combining the third intermediate position with multiples of the device size to produce a plurality of closely approximated positions, and locating the plurality of absolute positions of the target structure by;
  comparing the target structure shape to shapes of structures disposed in proximity to the closely approximated positions, and
  aligning the target structure shape to a closest matching one of the structures disposed in proximity to each of the closely approximated positions.

17. The method of claim 12 wherein the step of inputting the information further comprises inputting the substrate size, the pattern offset, and the device size in electronic form from stepper setup documentation.

18. The method of claim 12 wherein the first component of the device size further comprises a Y coordinate die size.

19. The method of claim 12 wherein the first component of the device size further comprises an X coordinate die size.

20. The method of claim 12 wherein the step of receiving the substrate in a known orientation further comprises:
  rotating the substrate about a first axis and substantially within a plane determined by the substrate,
  detecting a position indicating physical characteristic of the substrate, and
  stopping the rotation of the substrate when the substrate is in the known orientation relative to the position indicating physical characteristic of the substrate.

* * * * *